United States Patent
Kim et al.

(10) Patent No.: US 12,225,771 B2
(45) Date of Patent: Feb. 11, 2025

(54) DISPLAY DEVICE AND METHOD OF MANUFACTURING THE SAME

(71) Applicant: Samsung Display Co., Ltd., Yongin-si (KR)

(72) Inventors: Hyungjun Kim, Seoul (KR); Soyoung Koo, Yongin-si (KR); Eok Su Kim, Seoul (KR); Yunyong Nam, Hwaseong-si (KR); Jun Hyung Lim, Seoul (KR); Kyungjin Jeon, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 70 days.

(21) Appl. No.: 17/318,350

(22) Filed: May 12, 2021

(65) Prior Publication Data
US 2022/0077267 A1 Mar. 10, 2022

(30) Foreign Application Priority Data
Sep. 10, 2020 (KR) .................. 10-2020-0116144

(51) Int. Cl.
*H10K 59/121* (2023.01)
*H10K 59/126* (2023.01)
(Continued)

(52) U.S. Cl.
CPC ....... *H10K 59/1216* (2023.02); *H10K 59/126* (2023.02); *H10K 71/00* (2023.02); *H10K 59/1201* (2023.02); *H10K 59/123* (2023.02)

(58) Field of Classification Search
CPC ............. H01L 27/3265; H01L 27/3272; H01L 27/3248; H01L 2227/323; H01L 51/56
(Continued)

(56) References Cited

U.S. PATENT DOCUMENTS 8,637,347 B2 1/2014 Oikawa et al.
2004/0257489 A1 12/2004 Gotoh et al.
(Continued)

FOREIGN PATENT DOCUMENTS

CN 107068770 A 8/2017
CN 109166865 A 1/2019
(Continued)

OTHER PUBLICATIONS

Machine English translation of CN 110931509 A. (Year: 2020).*

*Primary Examiner* — Dzung Tran
(74) *Attorney, Agent, or Firm* — Womble Bond Dickinson

(57) ABSTRACT

A display device includes a first transistor including a first transistor including a light blocking pattern on a substrate, an active pattern on the light blocking pattern, and a gate electrode on the active pattern, a second transistor configured to provide a data voltage to the first transistor in response to a gate signal, and a storage capacitor electrically connected to the gate electrode and the light blocking pattern, and including a first conductive pattern in a same layer as the light blocking pattern, a second conductive pattern on the first conductive pattern and overlapping the first conductive pattern, a third conductive pattern in a same layer as the gate electrode, overlapping the second conductive pattern, and electrically connected to the first conductive pattern, and a fourth conductive pattern on the third conductive pattern, overlapping the third conductive pattern, and electrically connected to the second conductive pattern.

11 Claims, 16 Drawing Sheets

(51) Int. Cl.
*H10K 71/00* (2023.01)
*H10K 59/12* (2023.01)
*H10K 59/123* (2023.01)

(58) Field of Classification Search
USPC ............................................................ 257/71
See application file for complete search history.

(56) References Cited

U.S. PATENT DOCUMENTS

| 2011/0284838 | A1* | 11/2011 | Saito ..................... G11C 7/02 257/43 |
| 2013/0337596 | A1* | 12/2013 | Hung .................. H01L 27/1255 438/34 |
| 2016/0204180 | A1* | 7/2016 | Lee ................... H01L 21/28008 438/23 |
| 2017/0110049 | A1* | 4/2017 | Choi .................. H01L 27/3265 |
| 2017/0317155 | A1* | 11/2017 | Oh ...................... H01L 27/3258 |
| 2018/0012913 | A1* | 1/2018 | Lee ..................... H01L 27/1222 |
| 2018/0145123 | A1* | 5/2018 | Kim ..................... H01L 27/124 |
| 2018/0175127 | A1* | 6/2018 | Lee ..................... H01L 27/3265 |
| 2019/0148477 | A1* | 5/2019 | Park .................... H01L 27/3262 257/40 |
| 2020/0006401 | A1* | 1/2020 | Hwang ................ G09G 3/3225 |
| 2020/0066758 | A1 | 2/2020 | Yang et al. |
| 2020/0212137 | A1* | 7/2020 | Wang .................. G09G 3/3266 |
| 2021/0202600 | A1* | 7/2021 | Wang .................. H01L 27/3218 |

FOREIGN PATENT DOCUMENTS

| JP | 2017-10996 A | 1/2017 |
| JP | 2017-143285 A | 8/2017 |
| KR | 10-2010-0070082 A | 6/2010 |
| KR | 10-2014-0079093 A | 6/2014 |
| KR | 10-2016-0029487 A | 3/2016 |
| KR | 10-2018-0036818 A | 4/2018 |

* cited by examiner

DISPLAY DEVICE AND METHOD OF MANUFACTURING THE SAME

CROSS-REFERENCE TO RELATED APPLICATION

This application claims priority to, and the benefit of, Korean Patent Application No. 10-2020-0116144, filed on Sep. 10, 2020, which is hereby incorporated by reference for all purposes as if fully set forth herein.

BACKGROUND

1. Field

The present disclosure relates generally to a display device with improved display quality, and to a method of manufacturing the display device.

2. Discussion of the Background

A display device includes a plurality of pixels, and each of the pixels includes a plurality of transistors, at least one storage capacitor, and at least one light emitting diode. Capacitance may be stored in the storage capacitor, and the light emitting diode may generate light of a constant luminance based on the capacitance. Therefore, for the light emitting diode to generate light with a desired luminance, the capacitance must be sufficiently stored.

The above information disclosed in this Background section is only for understanding of the background of the disclosed concepts, and, therefore, it may contain information that does not constitute prior art.

SUMMARY

Some embodiments provide a display device with improved display quality.

Some embodiments provide a method of manufacturing the display device with improved quality.

A display device according to some embodiments may include a first transistor including a first transistor including a light blocking pattern on a substrate, an active pattern on the light blocking pattern, and a gate electrode on the active pattern, a second transistor configured to provide a data voltage to the first transistor in response to a gate signal, and a storage capacitor electrically connected to the gate electrode and the light blocking pattern, and including a first conductive pattern in a same layer as the light blocking pattern, a second conductive pattern on the first conductive pattern and overlapping the first conductive pattern, a third conductive pattern in a same layer as the gate electrode, overlapping the second conductive pattern, and electrically connected to the first conductive pattern, and a fourth conductive pattern on the third conductive pattern, overlapping the third conductive pattern, and electrically connected to the second conductive pattern.

The first conductive pattern and the second conductive pattern may form a first capacitance.

The second conductive pattern and the third conductive pattern may form a second capacitance.

The third conductive pattern and the fourth conductive pattern may form a third capacitance.

The first conductive pattern, the second conductive pattern, and the third conductive pattern may overlap each other.

The first conductive pattern, the second conductive pattern, and the fourth conductive pattern may overlap each other.

The first conductive pattern, the third conductive pattern, and the fourth conductive pattern may overlap each other.

The second conductive pattern, the third conductive pattern, and the fourth conductive pattern may overlap each other.

The display device may further include a semiconductor pattern in a same layer as the active pattern, and contacting the second conductive pattern.

The display device may further include a first electrode on the gate electrode, an emission layer on the first electrode, and a second electrode on the emission layer, wherein the fourth conductive pattern is in a same layer as the first electrode.

The display device may further include a bridge pattern in a same layer as the first electrode, and electrically connecting the first conductive pattern and the third conductive pattern.

The first conductive pattern, the third conductive pattern, and the gate electrode may be configured to receive a first signal, and the second conductive pattern, the fourth conductive pattern, and the light blocking pattern may be configured to receive a second signal.

The first conductive pattern and the third conductive pattern may include a same material.

A method of manufacturing a display device according to some embodiments may include forming a light blocking pattern and a first conductive pattern on a substrate, forming a preliminary active pattern on the first conductive pattern, forming a preliminary second conductive pattern on the preliminary active pattern, forming an active pattern and a second conductive pattern through a first etching process, wherein the second conductive pattern overlaps the first conductive pattern, forming a gate electrode and a third conductive pattern, wherein the gate electrode is on the active pattern and the third conductive pattern is on the second conductive pattern and overlaps the second conductive pattern, and forming a fourth conductive pattern on the third conductive pattern and overlapping the third conductive pattern, wherein the first conductive pattern and the third conductive pattern are electrically connected to each other, and wherein the second conductive pattern and the fourth conductive pattern are electrically connected to each other.

The method may further include forming a via insulating layer on the third conductive pattern, forming contact holes in the via insulating layer and exposing a first portion of the first conductive pattern, a second portion of the second conductive pattern, and a third portion of the third conductive pattern, and forming a bridge pattern on the via insulating layer and contacting the first portion and the third portion, wherein the fourth conductive pattern contacts the second portion.

The forming the active pattern and the second conductive pattern may include forming a first photoresist pattern and a second photoresist pattern on the preliminary second conductive pattern, forming the second conductive pattern overlapping the second photoresist pattern through the first etching process, forming the active pattern overlapping the first photoresist pattern through the first etching process, removing the first photoresist pattern, and removing at least a portion of the preliminary second conducive pattern that does not overlap the second photoresist pattern through a second etching process.

The forming the first photoresist pattern and the second photoresist pattern on the preliminary second conductive pattern may include forming a preliminary photoresist pattern, and forming the first photoresist pattern having a first thickness and the second photoresist pattern having a second thickness that is greater than the first thickness by using a halftone mask.

The first etching process may be performed using a first etchant for etching the preliminary active pattern and the preliminary second conductive pattern, and the second etching process is performed using a second etchant for etching the preliminary second conductive pattern.

The preliminary active pattern may include an oxide semiconductor, wherein the preliminary second conductive pattern includes an indium tin oxide, wherein the first etchant includes a sodium persulfate, and wherein the second etchant includes a sulfuric acid compound or a nitric acid compound.

The method may further include forming the third conductive pattern on the second conductive pattern and overlapping the second conductive pattern, and performing a plasma treatment on the active pattern.

Therefore, the display device according to some embodiments may include first to fourth conductive patterns that are sequentially stacked. The first conductive pattern and the third conductive pattern may be electrically connected to each other, and the second conductive pattern and the fourth conductive pattern may be electrically connected to each other. Accordingly, the first and second conductive patterns may constitute a first storage capacitor, the second and third conductive patterns may constitute a second storage capacitor, and the third and fourth conductive patterns may constitute a third storage capacitor. The first to third storage capacitors may be connected in parallel with each other. Accordingly, the capacitance can be sufficiently stored in the display device, and the display quality of the display device can be improved.

In addition, in the method of manufacturing a display device according to embodiments, the second conductive pattern may be formed together with an active pattern of a transistor, and the third conductive pattern may be formed together with a gate electrode of the transistor, and the fourth conductive pattern may be formed together with a first electrode of the light emitting diode. Accordingly, the method can be performed without adding masks for forming the second, third, and fourth conductive patterns.

It is to be understood that both the foregoing general description and the following detailed description are merely explanatory, and not limiting, and are intended to provide further explanation of the claimed embodiments.

BRIEF DESCRIPTION OF THE DRAWINGS

The accompanying drawings, which are included to provide a further understanding of the present disclosure and are incorporated in and constitute a part of this specification, illustrate embodiments of the disclosure, and together with the description serve to explain the disclosed concepts.

DETAILED DESCRIPTION

Figure 1:
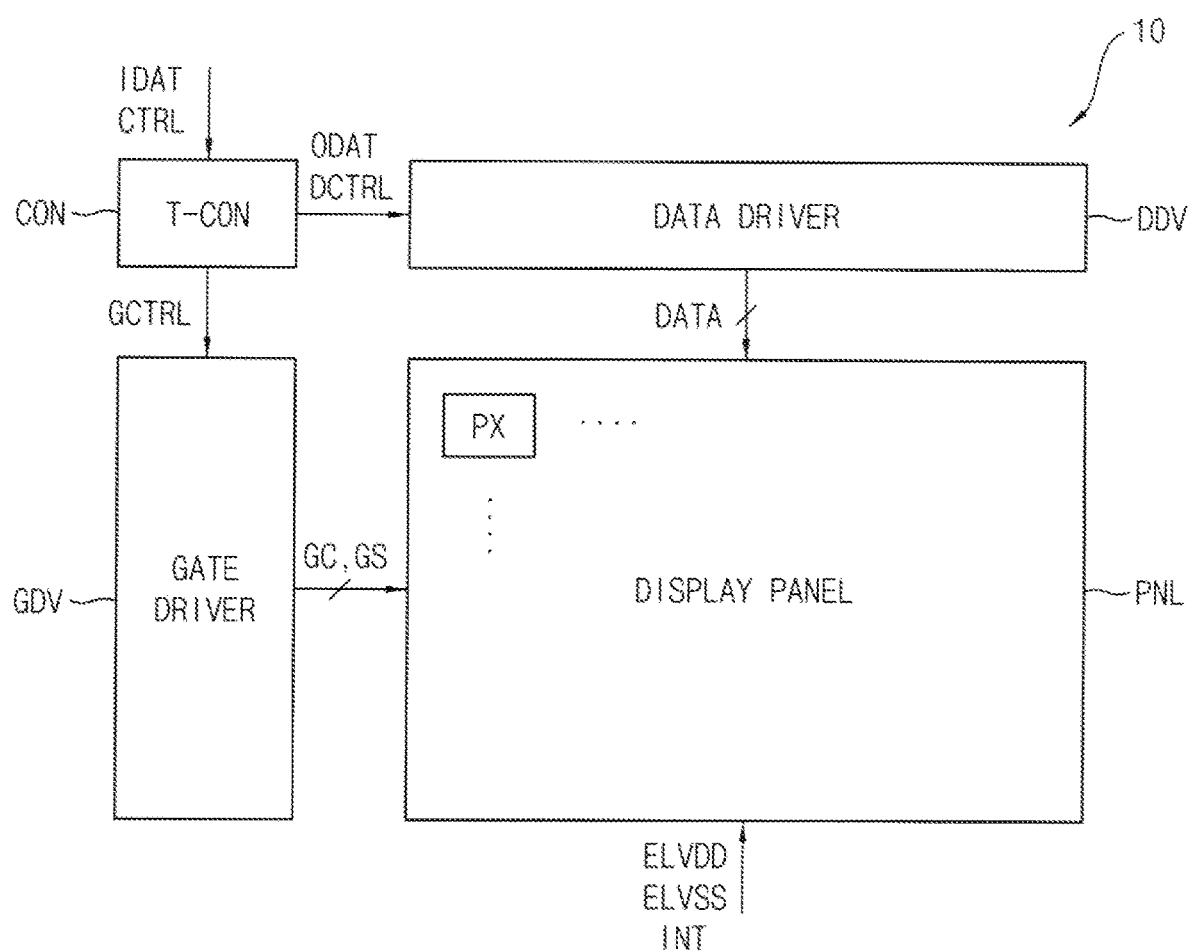
FIG. 1 is a block diagram illustrating a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device according to some embodiments.

Referring to FIG. 1, a display device 10 according to some embodiments may include a display panel PNL, a data driver DDV, a gate driver GDV, and a controller CON.

The display panel PNL may include a plurality of pixels PX. Each of the pixels PX may be provided with a data voltage DATA, a first gate signal GC, a second gate signal GS, a first power voltage ELVDD, a second power voltage ELVSS, and an initialization voltage INT.

The data driver DDV may generate the data voltage DATA based on an output image data ODAT and a data control signal DCTRL. For example, the data driver DDV may generate the data voltage DATA corresponding to the output image data ODAT, and may output the data voltage DATA in response to the data control signal DCTRL. The data control signal DCTRL may include an output data enable signal, a horizontal start signal, and a load signal. In some embodiments, the data driver DDV may be implemented as one or more integrated circuits (ICs), and may be electrically connected to the display panel PNL. In other embodiments, the data driver DDV may be mounted on the display panel PNL or may be integrated into the peripheral portion of the display panel PNL.

The gate driver GDV may generate the first gate signal GC and the second gate signal GS based on the gate control signal GCTRL. For example, each of the first and second gate signals GC and GS may include a gate-on voltage for turning on a transistor and a gate-off voltage for turning off the transistor. The gate control signal GCTRL may include a vertical start signal, a clock signal, and/or the like. In some embodiments, the gate driver GDV may be mounted on the display panel PNL. In other embodiments, the gate driver GDV may be implemented with one or more integrated circuits and may be electrically connected to the display panel PNL.

The controller CON (e.g., timing controller T-CON) may receive an input image data IDAT and a control signal CTRL from an external host processor (e.g., a graphics processing unit (GPU)). For example, the input image data IDAT may be RGB data including red image data, green image data, and blue image data. The control signal CTRL may include a vertical synchronization signal, a horizontal synchronization signal, an input data enable signal, a master clock signal, and/or the like. The controller CON may generate the gate control signal GCTRL, the data control signal DCTRL, and the output image data ODAT based on the input image data IDAT and the control signal CTRL.

Figure 2:
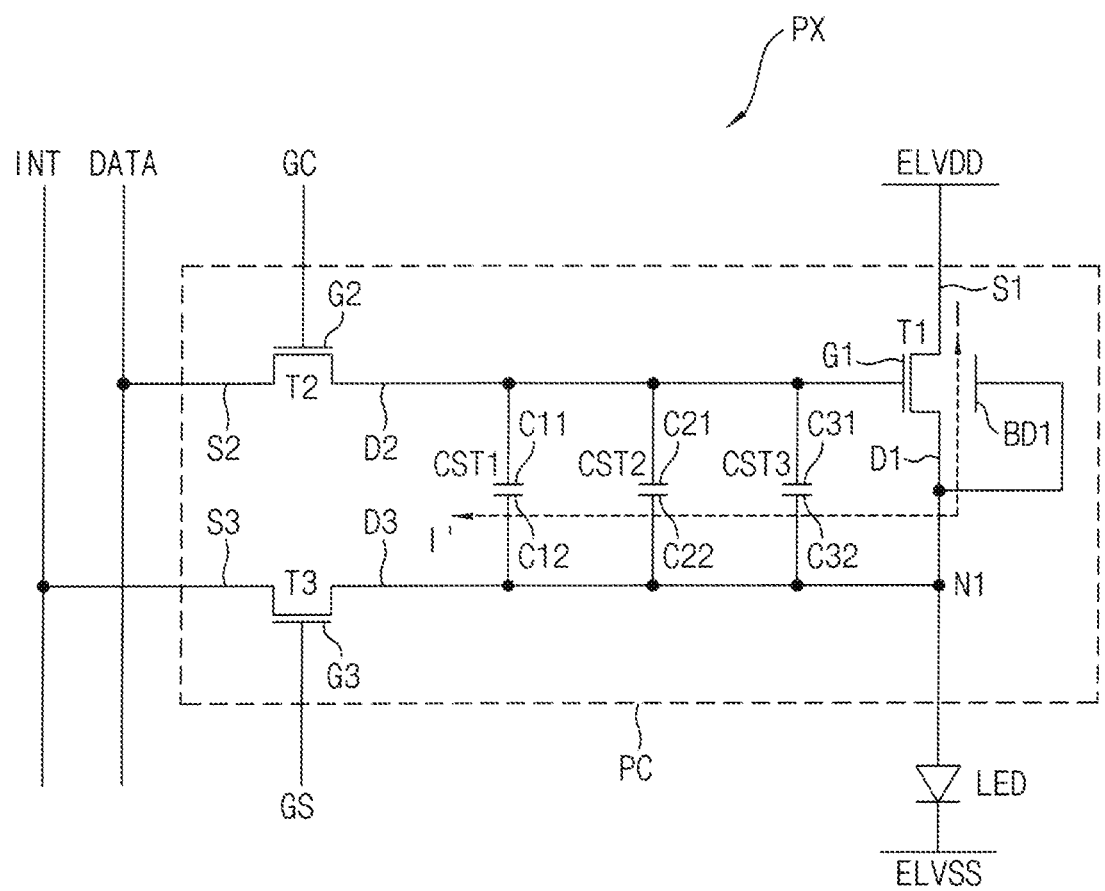
FIG. 2 is a circuit diagram illustrating an example of a pixel included in the display device of FIG. 1.

FIG. 2 is a circuit diagram illustrating an example of a pixel included in the display device of FIG. 1.

Referring to FIGS. 1 and 2, the pixel PX may include a pixel circuit PC and at least one light emitting diode LED. The pixel circuit PC may generate a driving current, and the light emitting diode LED may emit light based on the driving current. For example, the light emitting diode LED may be implemented as an organic light emitting diode, a quantum-nano light emitting diode, or the like.

The pixel circuit PC may include a first transistor T1, a second transistor T2, a third transistor T3, and a storage capacitor. The storage capacitor may include a first storage capacitor CST1, a second storage capacitor CST2, and a third storage capacitor CST3. The pixel circuit PC may be electrically connected to the light emitting diode LED to provide the driving current to the light emitting diode LED.

The first transistor T1 may include a gate terminal G1, a first terminal S1, a second terminal D1, and a third terminal BD1. The gate terminal G1 of the first transistor T1 may be connected to first capacitor terminals C11, C21, and C31 of the first to third storage capacitors CST1, CST2, and CST3. The first terminal S1 of the first transistor T1 may receive the first power voltage ELVDD. The second terminal D1 of the first transistor T1 may be connected to a first node N1. The third terminal BD1 of the first transistor T1 may be connected to the second terminal D1. The first transistor T1 may generate the driving current based on the first power voltage ELVDD and the data voltage DATA. The driving current may be provided to the light emitting diode LED through the first node N1. For example, the first transistor T1 may be referred to as a driving transistor.

The second transistor T2 may include a gate terminal G2, a first terminal S2, and a second terminal D2. The gate terminal G2 of the second transistor T2 may receive the first gate signal GC. The first terminal S1 of the second transistor T2 may receive the data voltage DATA. The second transistor T2 may provide the data voltage DATA to the first transistor T1 in response to the first gate signal GC. For example, during a period in which the second transistor T2 is turned on, the second terminal D2 of the second transistor T2 may provide the data voltage DATA to the gate terminal G1 of the first transistor T1.

The second transistor T2 may be turned on or off in response to the first gate signal GC. For example, when the second transistor T2 is an NMOS transistor, the second transistor T2 may be turned off when the first gate signal GC has a negative, or low, voltage level, and may be turned on when the first gate signal GC has a positive, or high, voltage level. For example, the second transistor T2 may be referred to as a switching transistor.

The third transistor T3 may include a gate terminal G3, a first terminal S3, and a second terminal D3. The gate terminal G3 of the third transistor T3 may receive the second gate signal GS. The first terminal S3 of the third transistor T3 may be connected to second capacitor terminals C12, C22, and C32 of the first to third storage capacitors CST1, CST2, and CST3. The second terminal D3 of the third transistor T3 may receive the initialization voltage INT.

The third transistor T3 may be turned on or off in response to the second gate signal GS. For example, when the third transistor T3 is the NMOS transistor, the third transistor T3 may be turned on when the second gate signal GS has a positive, or high, voltage level, and may be turned off when the second gate signal GS has a negative, or low, voltage level.

During a period in which the third transistor T3 is turned on in response to the second gate signal GS, the initialization voltage INT may be applied to the second capacitor terminals C12, C22, and C32 and the first node N1. For example, the third transistor T3 may be referred to as an initialization transistor.

The first to third storage capacitors CST1, CST2, and CST3 may be electrically connected to the gate terminal G1 of the first transistor T1 and the first node N1. The first to third storage capacitors CST1, CST2, and CST3 may be connected in parallel with each other. For example, the first capacitor terminals C11, C21, and C31 may be electrically connected to the gate terminal G1, and the second capacitor terminals C12, C22, and C32 may be electrically connected to the first node N1. Accordingly, a first signal may be provided to the first capacitor terminals C11, C21, and C31, and a second signal that is different from the first signal may be provided to the second capacitor terminals C12, C22, and C32.

In detail, the first storage capacitor CST1 may include the first capacitor terminal C11 and the second capacitor terminal C12. The first capacitor terminal C11 of the first storage capacitor CST1 may be connected to the gate electrode G1 of the first transistor T1, and the second capacitor terminal C12 of the first storage capacitor CST1 may be connected to the first node N1.

The second storage capacitor CST2 may include the first capacitor terminal C21 and the second capacitor terminal C22. The first capacitor terminal C21 of the second storage capacitor CST2 may be connected to the gate electrode G1 of the first transistor T1, and the second capacitor terminal C22 of the second storage capacitor CST2 may be connected to the first node N1.

The third storage capacitor CST3 may include the first capacitor terminal C31 and the second capacitor terminal C32. The first capacitor terminal C31 of the second storage capacitor CST3 may be connected to the gate electrode G1 of the first transistor T1, and the second capacitor terminal C32 of the second storage capacitor CST3 may be connected to the first node N1.

The light emitting diode LED may include a first terminal (e.g., an anode terminal) and a second terminal (e.g., a cathode terminal), the first terminal may be connected to the first node N1, and the second terminal may receive the second power voltage ELVSS. The light emitting diode LED may generate light having a luminance corresponding to the driving current.

Meanwhile, a connection structure between the pixel circuit PC and the light emitting diode LED shown in FIG. 2 is only one example and may be variously changed.

Figure 3:
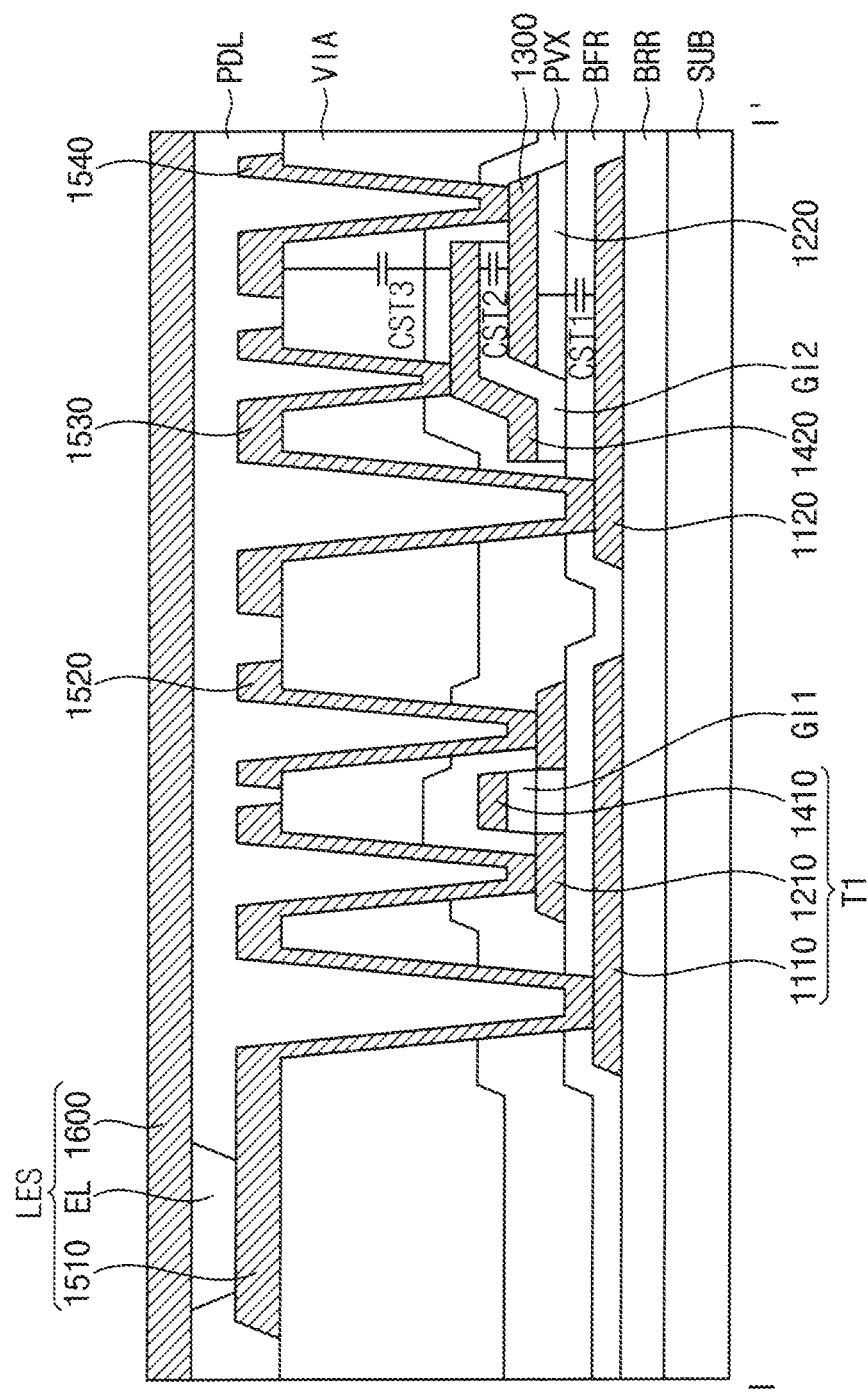
FIG. 3 is a cross-sectional view illustrating a first transistor, a first storage capacitor, a second storage capacitor, and a third storage capacitor included in the pixel of FIG. 2.

FIG. 3 is a cross-sectional view illustrating a first transistor, a first storage capacitor, a second storage capacitor, and a third storage capacitor included in the pixel of FIG. 2. For example, FIG. 3 may be a cross-sectional view taken along the line I-I' of FIG. 2.

Referring to FIGS. 1, 2, and 3, the display device 10 may include a substrate SUB, a barrier layer BRR, a light blocking pattern 1110, a first conductive pattern 1120, a buffer layer BFR, an active pattern 1210, a semiconductor pattern 1220, a first gate insulating pattern GI1, a second gate insulating pattern GI2, a second conductive pattern 1300, a gate electrode 1410, a third conductive pattern 1420, an intermediate film PVX, a via insulating layer VIA, a first electrode 1510, a first power voltage line 1520, a bridge pattern 1530, a fourth conductive pattern 1540, a pixel defining layer PDL, a light emitting layer EL, and a second electrode 1600.

For example, the light blocking pattern 1110, the active pattern 1210, and the gate electrode 1410 may constitute the first transistor T1. In addition, the first conductive pattern 1120 and the second conductive pattern 1300 may constitute the first storage capacitor CST1. The second conductive pattern 1300 and the third conductive pattern 1420 may constitute the second storage capacitor CST2. The third conductive pattern 1420 and the fourth conductive pattern 1540 may constitute the third storage capacitor CST3.

In some embodiments, to manufacture the display device 10, an additional conductive pattern might not be formed between the interlayer PVX and the via insulating layer VIA. In other words, the conventional display device includes the additional conductive pattern between the interlayer PVX and the via insulating layer VIA. On the other hand, the display device 10 might not include the additional conductive pattern. Accordingly, in the manufacturing process of the display device 10, a mask for forming the additional conductive pattern may be omitted.

The substrate SUB may include glass, quartz, plastic, or the like. In some embodiments, the substrate SUB may include glass. Accordingly, the display device 10 may be a rigid display device. In other embodiments, the substrate SUB may include plastic. Accordingly, the display device 10 may be a flexible display device.

The barrier layer BRR may be located on the substrate SUB. The barrier layer BRR may include an inorganic material. For example, the barrier layer BRR may include silicon oxide, silicon nitride, silicon oxynitride, aluminum oxide, or the like. The barrier layer BRR may reduce or prevent metal atoms or impurities from being diffused from the substrate SUB to an upper surface of the substrate SUB.

The light blocking pattern 1110 may be located on the barrier layer BRR. For example, the light blocking pattern 1110 may correspond to the third terminal BD1 of the first transistor T1 described with reference to FIG. 2.

In some embodiments, the light blocking pattern 1110 may include a conductive material. For example, the light blocking pattern 1110 may include a metal, a doped oxide semiconductor, a doped silicon semiconductor, or the like. For example, the light blocking pattern 1110 may include copper (Cu). The light blocking pattern 1110 may reduce or prevent external light reaching the active pattern 1210. Accordingly, a leakage current of the first transistor T1 may be reduced, and an electrical characteristic of the first transistor T1 may be improved.

The first conductive pattern 1120 may be located on the barrier layer BRR. For example, the first conductive pattern 1120 may correspond to the first capacitor terminal C11 of the first storage capacitor CST1 described with reference to FIG. 2.

In some embodiments, the first conductive pattern 1120 may include a conductive material. For example, the first conductive pattern 1120 may include a metal, a doped oxide semiconductor, a doped silicon semiconductor, or the like. For example, the first conductive pattern 1120 may include copper (Cu).

In some embodiments, the first conductive pattern 1120 may include the same material as the light blocking pattern 1110. In addition, the first conductive pattern 1120 may be electrically insulated from the light blocking pattern 1110. For example, the second signal may be provided to the light blocking pattern 1110, and the first signal may be provided to the first conductive pattern 1120.

The buffer layer BFR may be located on the barrier layer BRR. The buffer layer BFR may cover the light blocking pattern 1110 and the first conductive pattern 1120. The buffer layer BFR may include an inorganic material. For example, the buffer layer BFR may include silicon oxide, silicon nitride, silicon oxynitride, aluminum oxide, or the like.

The active pattern 1210 may be located on the buffer layer BFR. In some embodiments, the active pattern 1210 may include an oxide semiconductor. For example, the active pattern 1210 may include zinc (Zn), indium (In), gallium (Ga), tin (Sn), aluminum (Al), zinc oxide (ZnO), indium oxide (InO), indium gallium zinc oxide (In—Ga—Zn—O), zinc tin oxide (Zn—Sn—O), and/or the like. For example, the active pattern 1210 may include indium gallium zinc oxide and tin. In addition, the active pattern 1210 may include a source region, a drain region, and a channel region located between the source region and the drain region. The source region and the drain region may be doped regions. In other embodiments, the active pattern 1210 may include a silicon semiconductor. For example, the active pattern 1210 may include amorphous silicon, polycrystalline silicon, or the like.

The semiconductor pattern 1220 may be located on the buffer layer BFR. In some embodiments, the semiconductor pattern 1220 may include the same material as the active pattern 1210. In addition, the semiconductor pattern 1220 may not be doped. Accordingly, the semiconductor pattern 1220 may function as an insulating pattern.

The second conductive pattern 1300 may be located on the semiconductor pattern 1220. For example, the second conductive pattern 1300 may be the second capacitor terminal C12 of the first storage capacitor CST1 and the second capacitor terminal C22 of the second storage capacitor CST2 described with reference to FIG. 2.

In some embodiments, the second conductive pattern 1300 may overlap the semiconductor pattern 1220. For example, the second conductive pattern 1300 may contact the semiconductor pattern 1220.

In some embodiments, the second conductive pattern 1300 may include a conductive material. For example, the second conductive pattern 1300 may include a metal, a doped oxide semiconductor, a doped silicon semiconductor, or the like. For example, the second conductive pattern 1300 may include indium tin oxide.

In some embodiments, the first conductive pattern 1120 and the second conductive pattern 1300 may constitute the first storage capacitor CST1. For example, the first signal may be provided to the first conductive pattern 1120, and the second signal may be provided to the second conductive pattern 1300. The second conductive pattern 1300 may be electrically connected to the light blocking pattern 1110. In other words, the first conductive pattern 1120 may correspond to the first capacitor terminal C11 of the first storage capacitor CST1, and the second conductive pattern 1300 may correspond to the second capacitor terminal C12 of the first storage capacitor CST1. Accordingly, a first capacitance may be formed in the buffer layer BFR and the semiconductor pattern 1220. The first capacitance may be stored in the first storage capacitor CST1.

The first gate insulating pattern GI1 may be located on the active pattern 1210. The first gate insulating pattern GI1 may include an inorganic material. For example, the first gate insulating pattern GI1 may include silicon oxide, silicon nitride, silicon oxynitride, aluminum oxide, or the like. The first gate insulating pattern GI1 may electrically insulate the active pattern 1210 and the gate electrode 1410.

The second gate insulating pattern GI2 may be located on the second conductive pattern 1300. The second gate insulating pattern GI2 may partially cover the semiconductor pattern 1220 and the second conductive pattern 1300. In some embodiments, the second gate insulating pattern GI2 may include the same material as the first gate insulating pattern GI1. The second gate insulating pattern GI2 may electrically insulate the second conductive pattern 1300 and the third conductive pattern 1420.

The gate electrode 1410 may be located on the first gate insulating pattern GI1. In some embodiments, the gate electrode 1410 may overlap the channel region of the active pattern 1210 and the first gate insulating pattern GI1. The gate electrode 1410 may include a conductive material. For example, the gate electrode 1410 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and/or the like. For example, the gate electrode 1410 may include copper (Cu).

In some embodiments, the gate electrode 1410 may correspond to the gate terminal G1 of the first transistor T1. For example, the first signal may be provided to the gate electrode 1410. In other words, the gate electrode 1410 may be electrically connected to the first conductive pattern 1120.

The third conductive pattern 1420 may be located on the second gate insulating pattern GI2. For example, the third conductive pattern 1420 may be the first capacitor terminal C21 of the second storage capacitor CST2 and the first capacitor terminal C31 of the third storage capacitor CST3 described with reference to FIG. 2.

In some embodiments, the third conductive pattern 1420 may overlap the second gate insulating pattern GI2. For example, the third conductive pattern 1420 may contact the second gate insulating pattern GI2. In addition, the third conductive pattern 1420 may be located in the same layer as the gate electrode 1410 and may include the same material.

In some embodiments, the third conductive pattern 1420 may include a conductive material. For example, the third conductive pattern 1420 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and/or the like. For example, the third conductive pattern 1420 may include copper (Cu).

In some embodiments, the second conductive pattern 1300 and the third conductive pattern 1420 may constitute the second storage capacitor CST2. For example, the second signal may be provided to the second conductive pattern 1300, and the first signal may be provided to the third conductive pattern 1420. The third conductive pattern 1420 may be electrically connected to the gate electrode 1410. In other words, the second conductive pattern 1300 may correspond to the second capacitor terminal C22 of the second storage capacitor CST2, and the third conductive pattern 1420 may correspond to first capacitor terminal C21 of the second storage capacitor CST2. Accordingly, a second capacitance may be formed in the second gate insulating pattern GI2. The second capacitance may be stored in the second storage capacitor CST2.

The intermediate layer PVX may be located on the buffer layer BFR. The intermediate layer PVX may cover the active pattern 1210, the gate electrode 1410, the second conductive pattern 1300, and the third conductive pattern 1420. The interlayer PVX may include an inorganic material. For example, the interlayer PVX may include silicon oxide, silicon nitride, silicon oxynitride, aluminum oxide, or the like.

The via insulating layer VIA may be located on the intermediate layer PVX. The via insulating layer VIA may include an organic material. For example, the via insulating layer VIA may include a photoresist, a polyacrylic resin, a polyimide resin, an acrylic resin, or the like. The via insulating layer VIA may have a substantially flat top surface.

In some embodiments, the first electrode 1510, the emission layer EL, and the second electrode 1600 may constitute a light emitting structure LES.

The first electrode 1510 may be located on the via insulating layer VIA. The first electrode 1510 may include a metal, an alloy, a conductive metal oxide, a transparent conductive material, or the like. For example, the first electrode 1510 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and/or the like. For example, the first electrode 1510 may have a stacked structure of Ag/ITO/Ag. In some embodiments, the first electrode 1510 may connect the drain region of the active pattern 1210 and the light blocking pattern 1110.

The pixel defining layer PDL may be located on the via insulating layer VIA. The pixel defining layer PDL may expose an upper surface of the first electrode 1510. The pixel defining layer PDL may include an organic material. For example, the pixel defining layer PDL may include a photoresist, a polyacrylic resin, a polyimide resin, an acrylic resin, or the like.

The emission layer EL may be located on the first electrode 1510. For example, the emission layer EL may include an organic light emitting material, a nano light emitting material, or the like. The emission layer EL may emit light by receiving the driving current.

The second electrode 1600 may be located on the emission layer EL. In some embodiments, the second electrode 1600 may be arranged in a plate shape. The second electrode 1600 may include a metal, an alloy, a conductive metal oxide, a transparent conductive material, or the like. For example, the second electrode 1600 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and/or the like.

The first power voltage line 1520 may be located on the via insulating layer VIA. The first power voltage line 1520 may be located in the same layer as the first electrode 1510 and may include the same material. In some embodiments, the first power voltage line 1520 may contact the source region of the active pattern 1210. For example, the first power voltage line 1520 may provide the first power voltage ELVDD to the source region.

The bridge pattern 1530 may be located on the via insulating layer VIA. The bridge pattern 1530 may be located in the same layer as the first electrode 1510 and may include the same material. The bridge pattern 1530 may connect the first conductive pattern 1120 and the third conductive pattern 1420.

The fourth conductive pattern 1540 may be located on the via insulating layer VIA. For example, the fourth conductive pattern 1540 may correspond to the second capacitor terminal C32 of the third storage capacitor CST3 described with reference to FIG. 2.

In some embodiments, the fourth conductive pattern 1540 may be located in the same layer as the first electrode 1510 and may include the same material. The fourth conductive pattern 1540 may be connected to the second conductive pattern 1300.

In some embodiments, the third conductive pattern 1420 and the fourth conductive pattern 1540 may constitute the third storage capacitor CST3. For example, the first signal may be provided to the third conductive pattern 1420 and the second signal may be provided to the fourth conductive pattern 1540. The fourth conductive pattern 1540 may be electrically connected to the light blocking pattern 1110. In other words, the third conductive pattern 1420 corresponds to the first capacitor terminal C31 of the third storage capacitor CST3, and the fourth conductive pattern 1540 may correspond to the second capacitor terminal C32 of the third storage capacitor CST3. Accordingly, a third capacitance may be formed in the intermediate layer PVX and the via insulating layer VIA. The third capacitance may be stored in the third storage capacitor CST3.

In some embodiments, the first conductive pattern 1120, the second conductive pattern 1300, the third conductive pattern 1420, and the fourth conductive pattern 1540 may overlap each other.

The display device 10 may include first to fourth conductive patterns 1120, 1300, 1420, and 1540. The first and third conductive patterns 1120 and 1420 may be electrically connected to each other, and the second and fourth conductive patterns 1300 and 1540 may be electrically connected to each other. For example, the first signal may be provided to the first and third conductive patterns 1120 and 1420, and the second signal may be provided to the second and fourth conductive patterns 1300 and 1540. In other words, the first and third conductive patterns 1120 and 1420 may correspond to the first terminals C11, C21, and C31, and the second and fourth conductive patterns 1300 and 1540 may correspond to the second terminals C21, C22, and C32. The display device 10 may include the first to fourth conductive patterns 1120, 1300, 1420, and 1540, so that first to third capacitances may be stored in the display device 10. In addition, by adjusting the areas of the first to fourth conductive patterns 1120, 1300, 1420, and 1540, the first to third capacitances may be adjusted. Accordingly, display quality of the display device 10 may be improved.

FIGS. 4, 5, 6, 7, 8, 9, 10, 11, 12, 13, 14, 15, and 16 are cross-sectional views illustrating a method of manufacturing a display device according to some embodiments.

Figure 4:
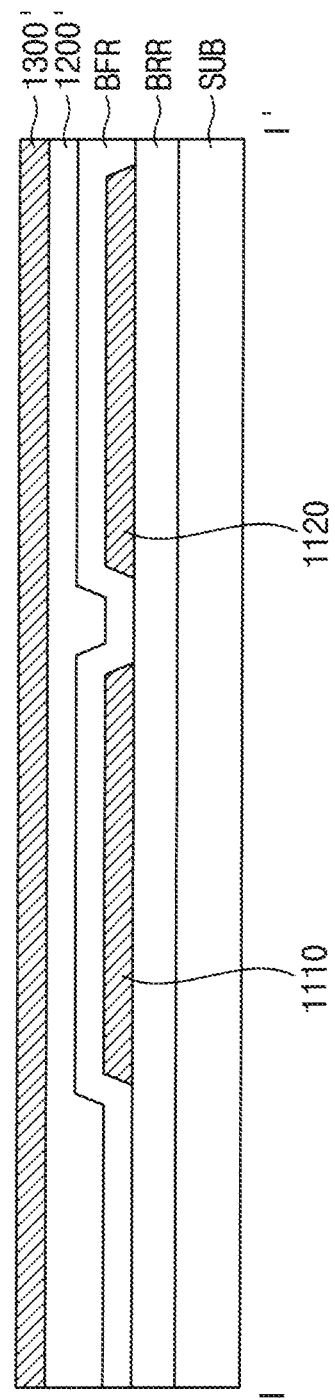
FIGS. 4, 5, 6, 7, 8, 9, 10, 11, 12, 13, 14, 15, and 16 are cross-sectional views illustrating a method of manufacturing a display device according to some embodiments.

Referring to FIGS. 3 and 4, in the method of manufacturing the display device 10 according to some embodiments, the barrier layer BRR may be formed on the substrate SUB, the light blocking pattern 1110 and the first conductive pattern 1120 may be formed on the barrier layer BRR, and the buffer layer BFR may be formed on the barrier layer BRR. A preliminary active pattern 1200' may be formed on the buffer layer BFR, and a preliminary second conductive pattern 1300' may be formed on the preliminary active pattern 1200'. In some embodiments, the preliminary active pattern 1200' may include an oxide semiconductor, and may be entirely formed on the buffer layer BFR. In some embodiments, the preliminary second conductive pattern 1300' may include indium tin oxide and may be entirely formed on the preliminary active pattern 1200'.

Figure 5:
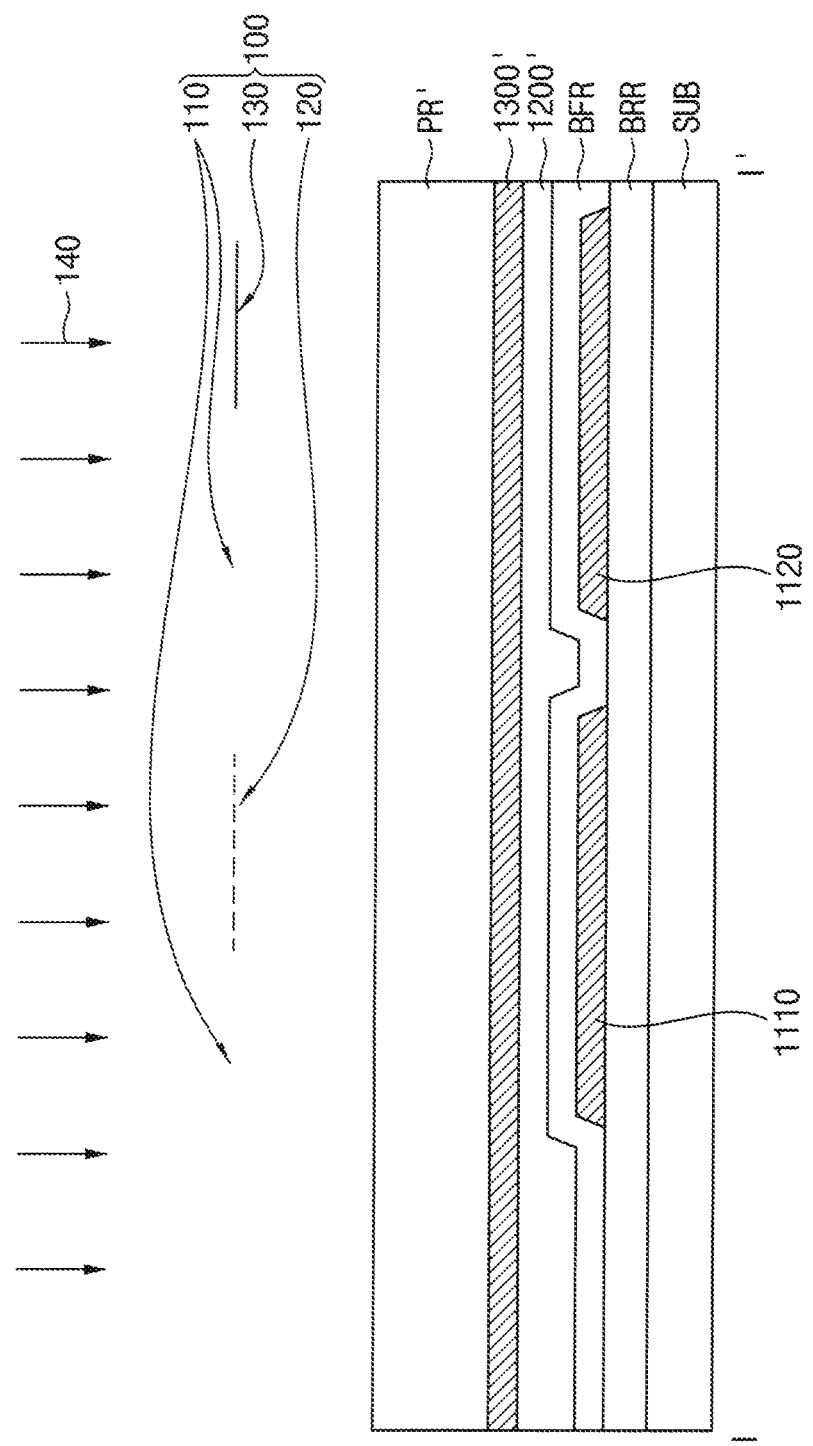

Referring to FIGS. 3 and 5, a preliminary photoresist pattern PR' may be formed on the preliminary second conductive pattern 1300'. In addition, a halftone mask 100 may be arranged on the preliminary photoresist pattern PR'. Light 140 may be irradiated on the halftone mask 100 toward the preliminary photoresist pattern PR'. The halftone mask 100 may include a first light transmitting part 110, a second light transmitting part 120, and a light blocking part 130. The first light transmitting part 110 may transmit the light 140. For example, the first light transmitting part 110 may be a glass or quartz substrate. The light blocking part 130 may block the light 140. For example, the light blocking part 130 may be a substrate including chromium (Cr), tungsten (W), or the like. The light transmittance of the second light transmitting part 120 may be smaller than the light transmittance of the first light transmitting part 110 and greater than the light transmittance of the light blocking part 130.

Figure 6:
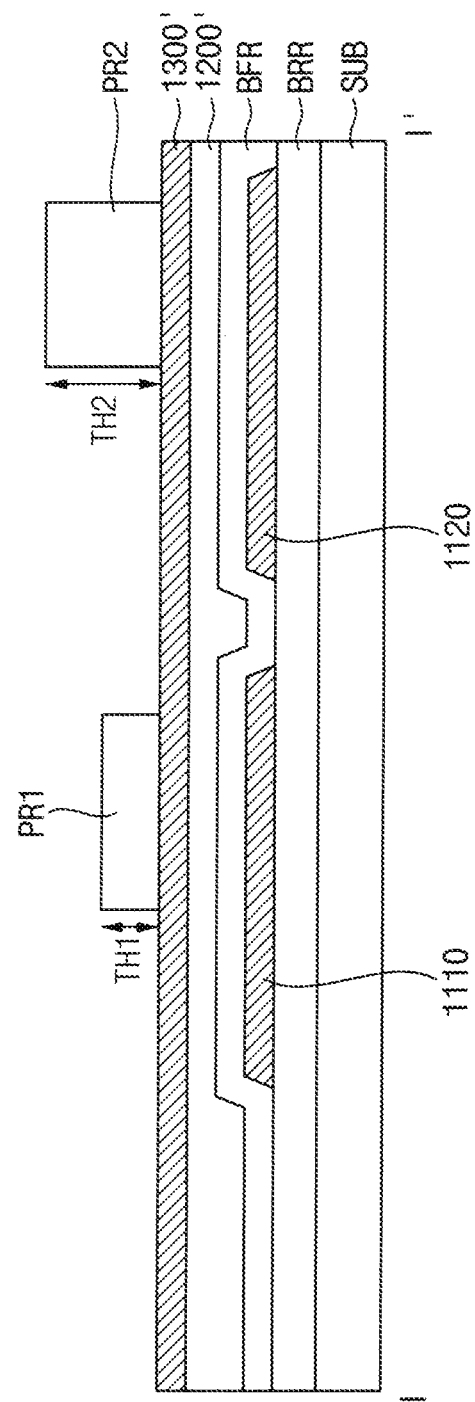

Referring to FIGS. 3 and 6, a first photoresist pattern PR1 and a second photoresist pattern PR2 may be formed using the halftone mask 100. The first photoresist pattern PR1 may have a first thickness TH1, and the second photoresist pattern PR2 may have a second thickness TH2 that is greater than the first thickness TH1.

Figure 7:
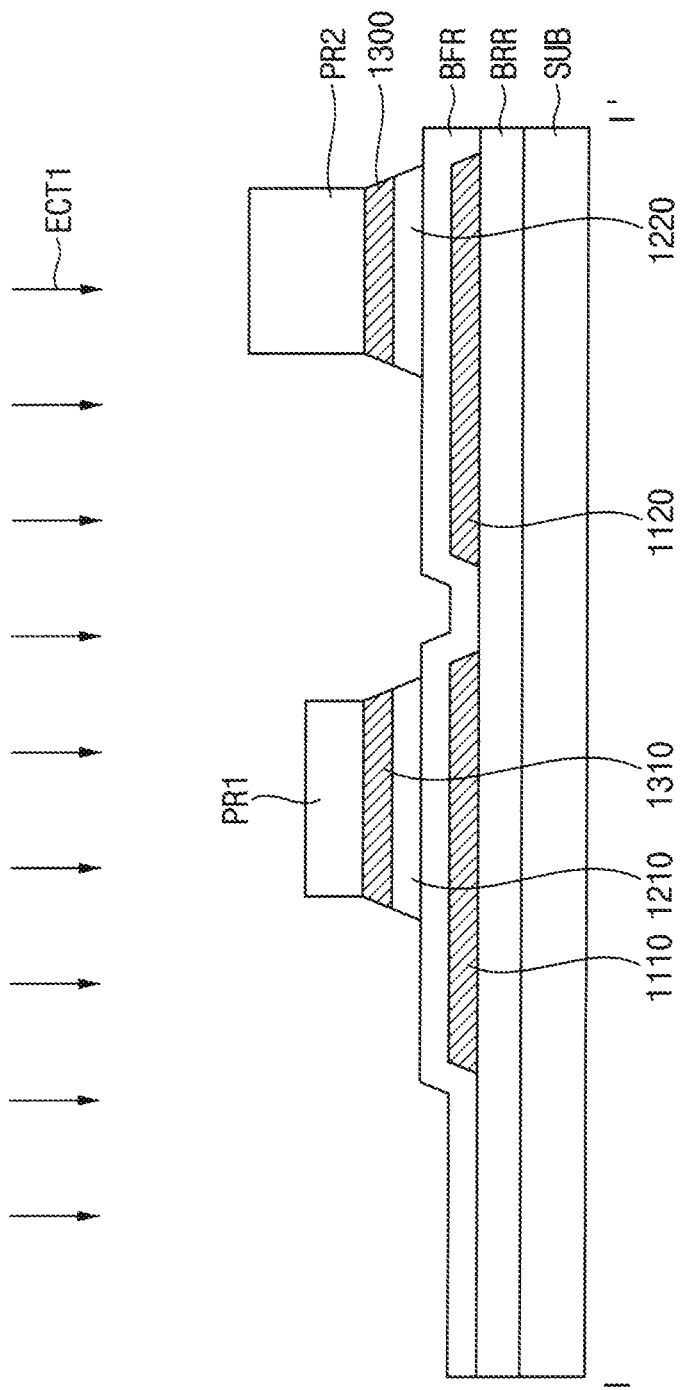

Referring to FIGS. 3 and 7, the preliminary second conductive pattern 1300' and the preliminary active pattern 1200' may be patterned through a first etching process. In some embodiments, the first etching process may be performed by using a first etchant ECT1 capable of removing the preliminary second conductive pattern 1300' and the preliminary active pattern 1200'. In other words, the etch selectivity between the preliminary second conductive pattern 1300' and the preliminary active pattern 1200' for the first etchant ECT1 may be low. For example, the first etchant ECT1 may include sodium persulfate. As the preliminary second conductive pattern 1300' and the preliminary active pattern 1200' are patterned, the first pattern 1310 and the active pattern 1210 overlapping the first photoresist pattern PR1 may be formed, and the second conductive pattern 1300 and the semiconductor pattern 1220 overlapping the second photoresist pattern PR2 may be formed.

Figure 8:
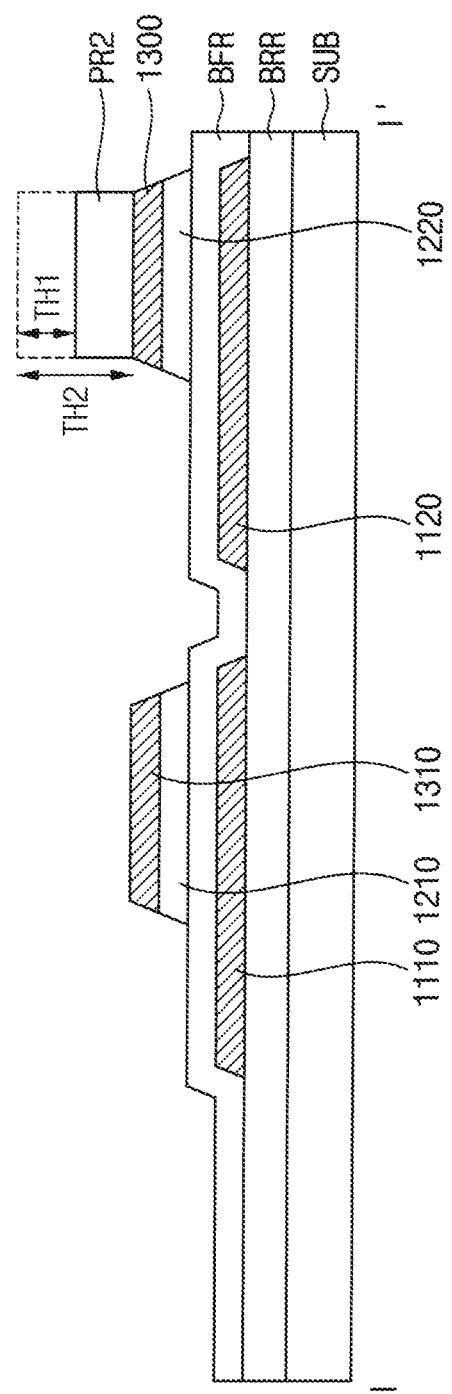

Referring to FIGS. 3 and 8, the first photoresist pattern PR1 may be removed through an ashing process, and the second thickness TH2 of the second photoresist pattern PR2 may be reduced by the first thickness TH1.

Figure 9:
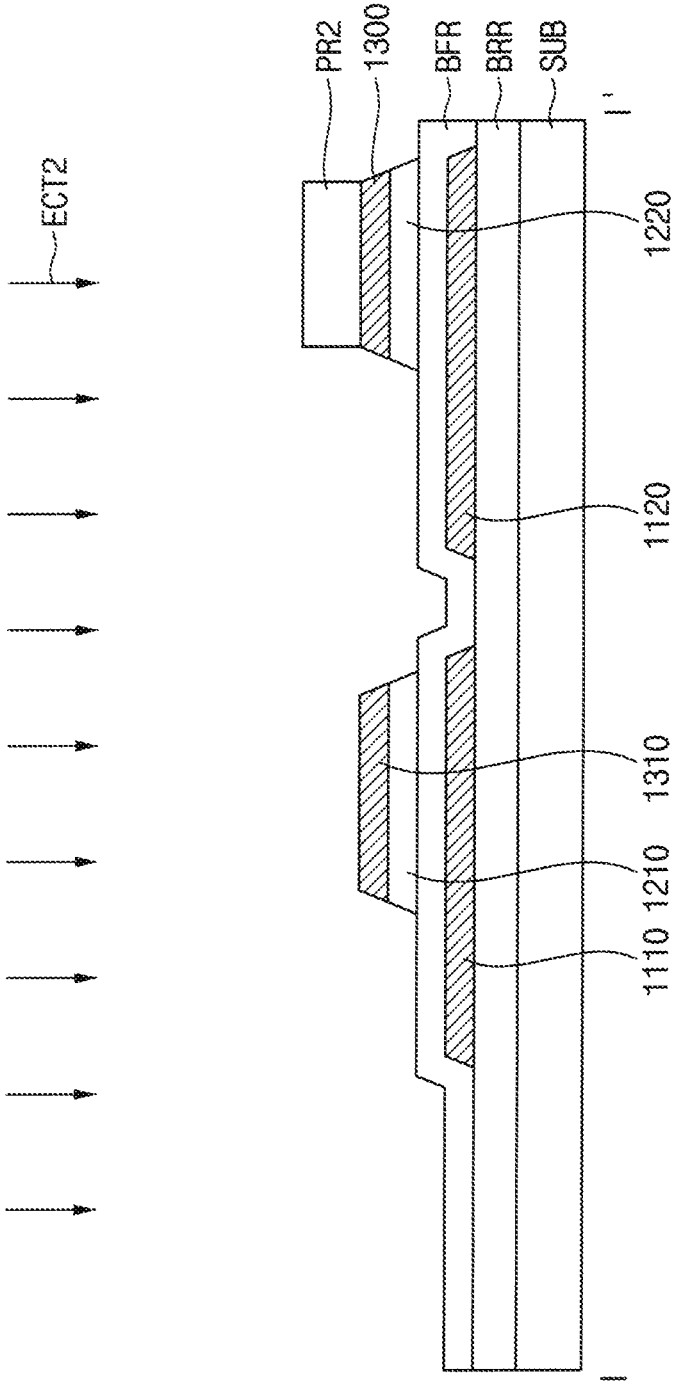

Referring to FIGS. 3 and 9, the first pattern 1310, which does not overlap the second photoresist pattern PR2, may be removed through a second etching process. In some embodiments, the second etching process may be performed using a second etchant ECT2 capable of removing the first pattern 1310. In other words, the etch selectivity between the first pattern 1310 and the active pattern 1210 for the second etchant ECT2 may be high. For example, the second etchant ECT2 may include a sulfuric acid compound or a nitric acid compound.

Figure 10:
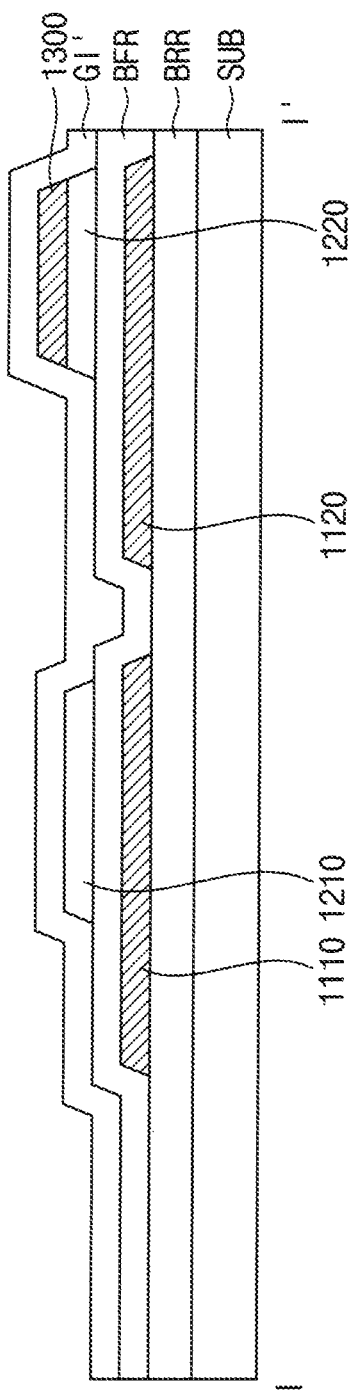

Referring to FIGS. 3 and 10, a preliminary gate insulating pattern GI' may be formed on the buffer layer BFR. The preliminary gate insulating pattern GI' may cover the active pattern 1210 and the second conductive pattern 1300. In addition, a heat treatment process (e.g., an annealing process) may be performed. For example, when heat is applied to the second conductive pattern 1300, the second conductive pattern 1300 may crystallize from an amorphous structure to a crystalline structure. In detail, when the second conductive pattern 1300 includes indium tin oxide, when heat is applied to the second conductive pattern 1300, the second conductive pattern 1300 may be crystallized from a-ITO (amorphous-ITO) to c-ITO (crystallized ITO).

Figure 11:
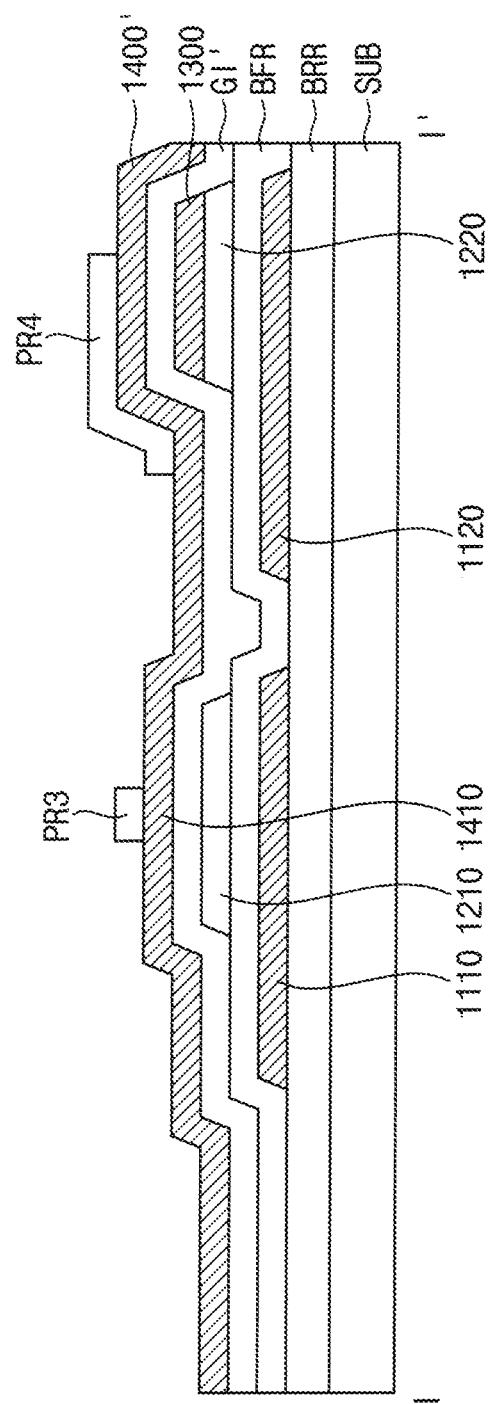

Referring to FIGS. 3 and 11, a preliminary third conductive pattern 1400' may be formed on the preliminary gate insulating pattern GI'. In addition, a third photoresist pattern PR3 and a fourth photoresist pattern PR4 may be formed on the preliminary third conductive pattern 1400'.

Figure 12:
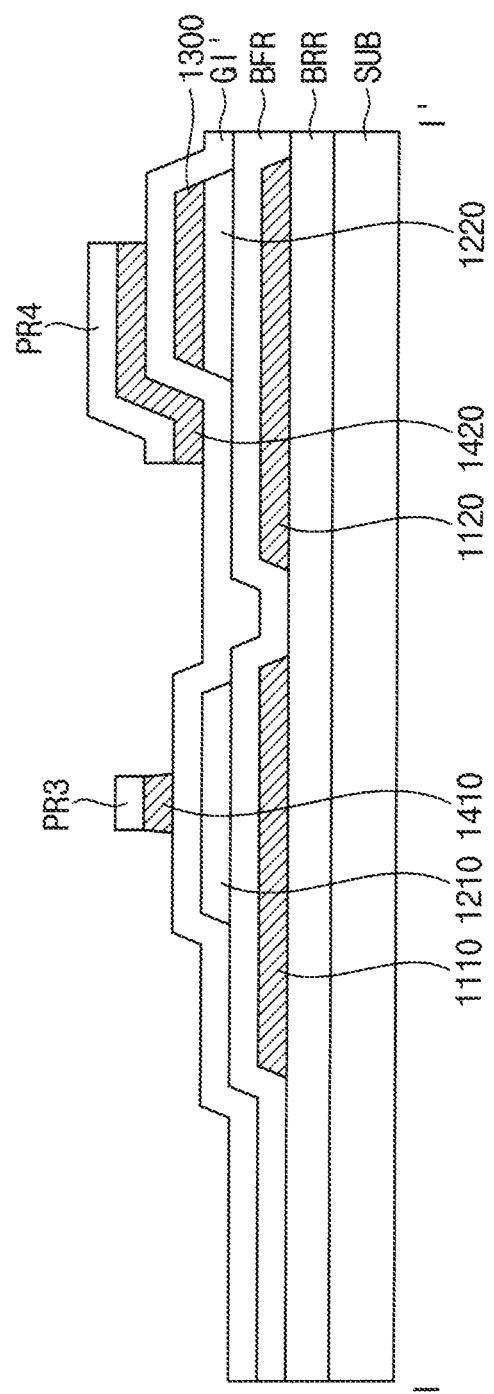

Referring to FIGS. 3 and 12, the preliminary third conductive pattern 1400' may be patterned. For example, the gate electrode 1410 overlapping the third photoresist pattern PR3 and the third conductive pattern 1420 overlapping the fourth photoresist pattern PR4 may be formed.

Figure 13:
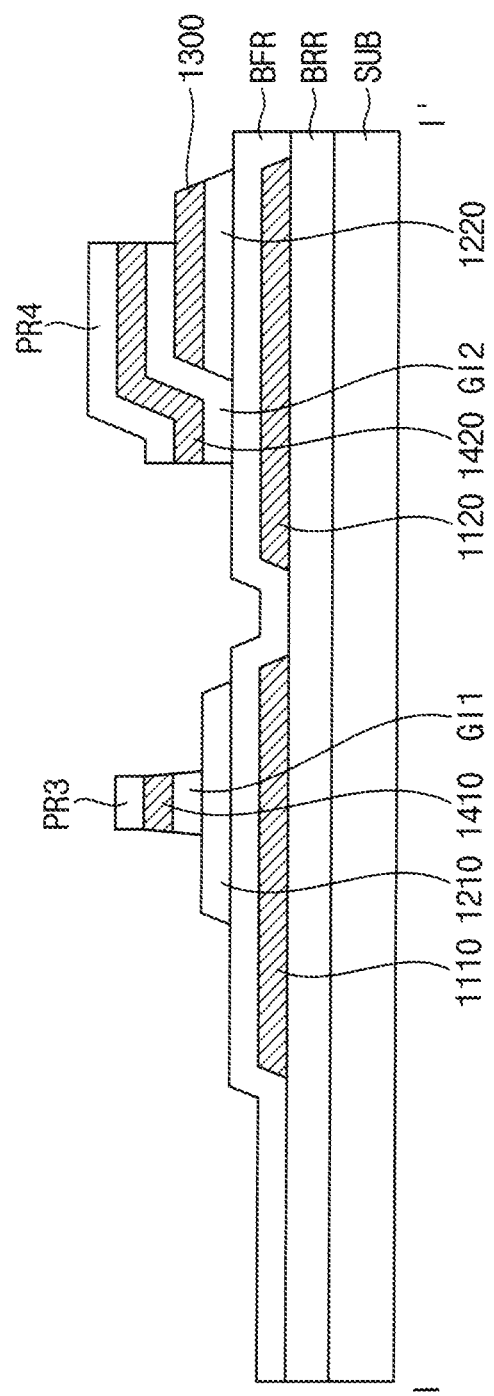

Referring to FIGS. 3 and 13, the preliminary gate insulating pattern GI' may be patterned. For example, the first gate insulating pattern GI1 overlapping the gate electrode 1410 and the second gate insulating pattern GI2 overlapping the third conductive pattern 1420 may be formed. Accordingly, one or more portions of the active pattern 1210 that do not overlap the gate electrode 1410 may be exposed.

Figure 14:
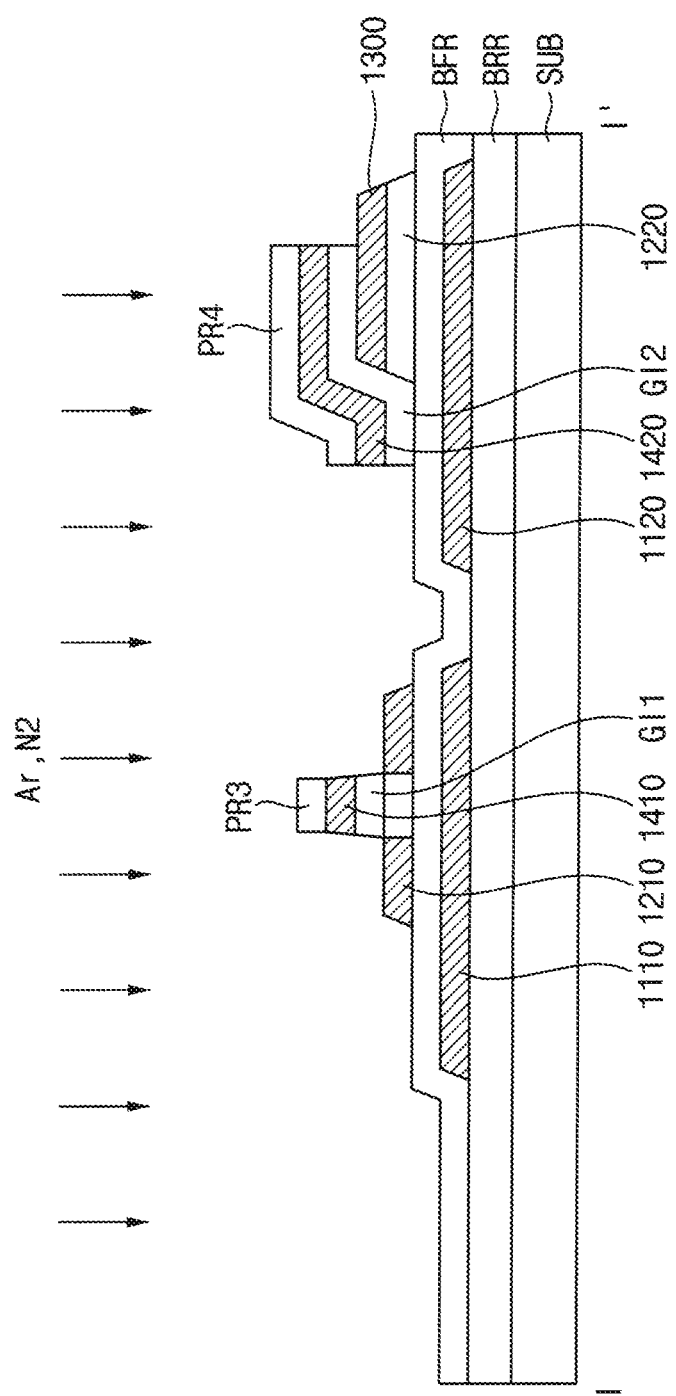

Referring to FIGS. 3 and 14, plasma treatment may be performed on the exposed active pattern 1210. Vacancy may be formed in the exposed active pattern 1210 through plasma treatment. Accordingly, a source region 1211, a drain region 1212, and a channel region 1213 of the active pattern 1210 may be formed.

Figure 15:
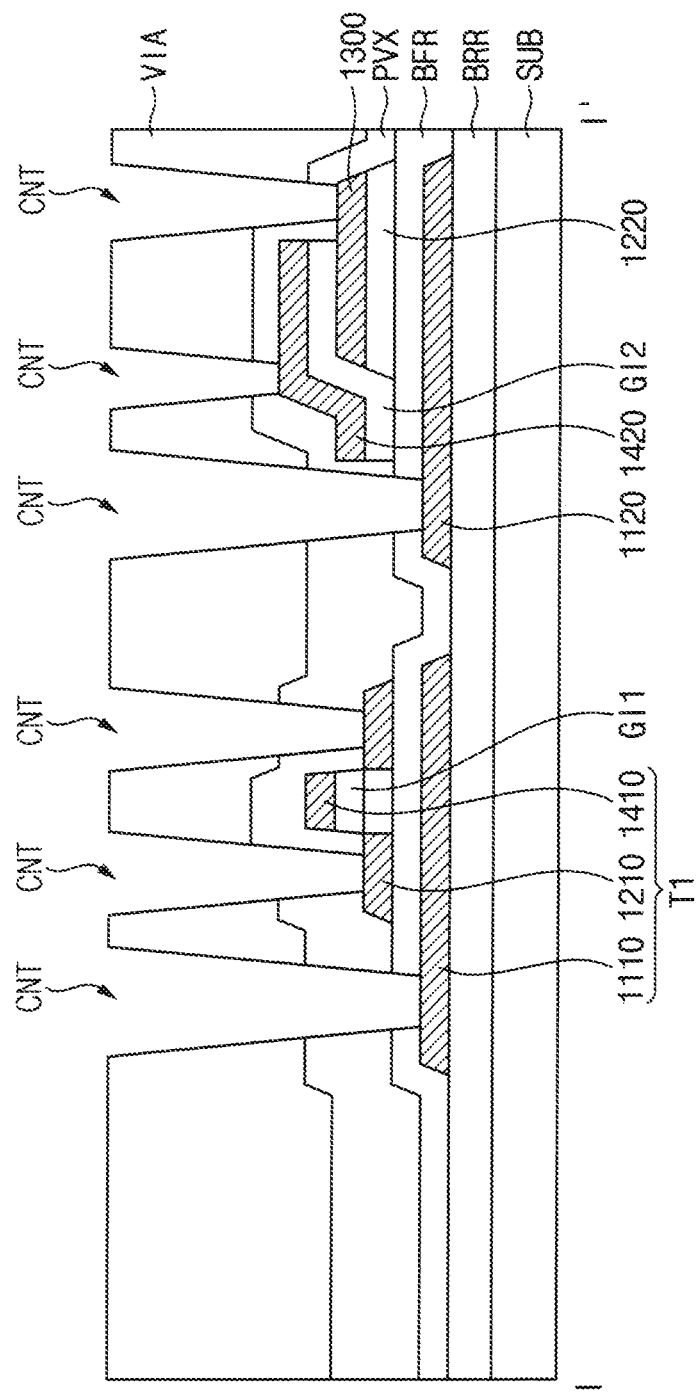

Referring to FIGS. 3 and 15, the intermediate layer PVX may be formed on the buffer layer BFR, and the via insulating layer VIA may be formed on the intermediate layer PVX. In addition, contact holes CNT may be formed in the intermediate layer PVX and the via insulating layer VIA. The contact holes CNT may expose an upper surface of the light blocking pattern 1110, an upper surface of the drain region 1212, an upper surface of the source region 1211, an upper surface of the first conductive pattern 1120, and an upper surface of the third conductive pattern 1420, and an upper surface of the second conductive pattern 1300.

Figure 16:
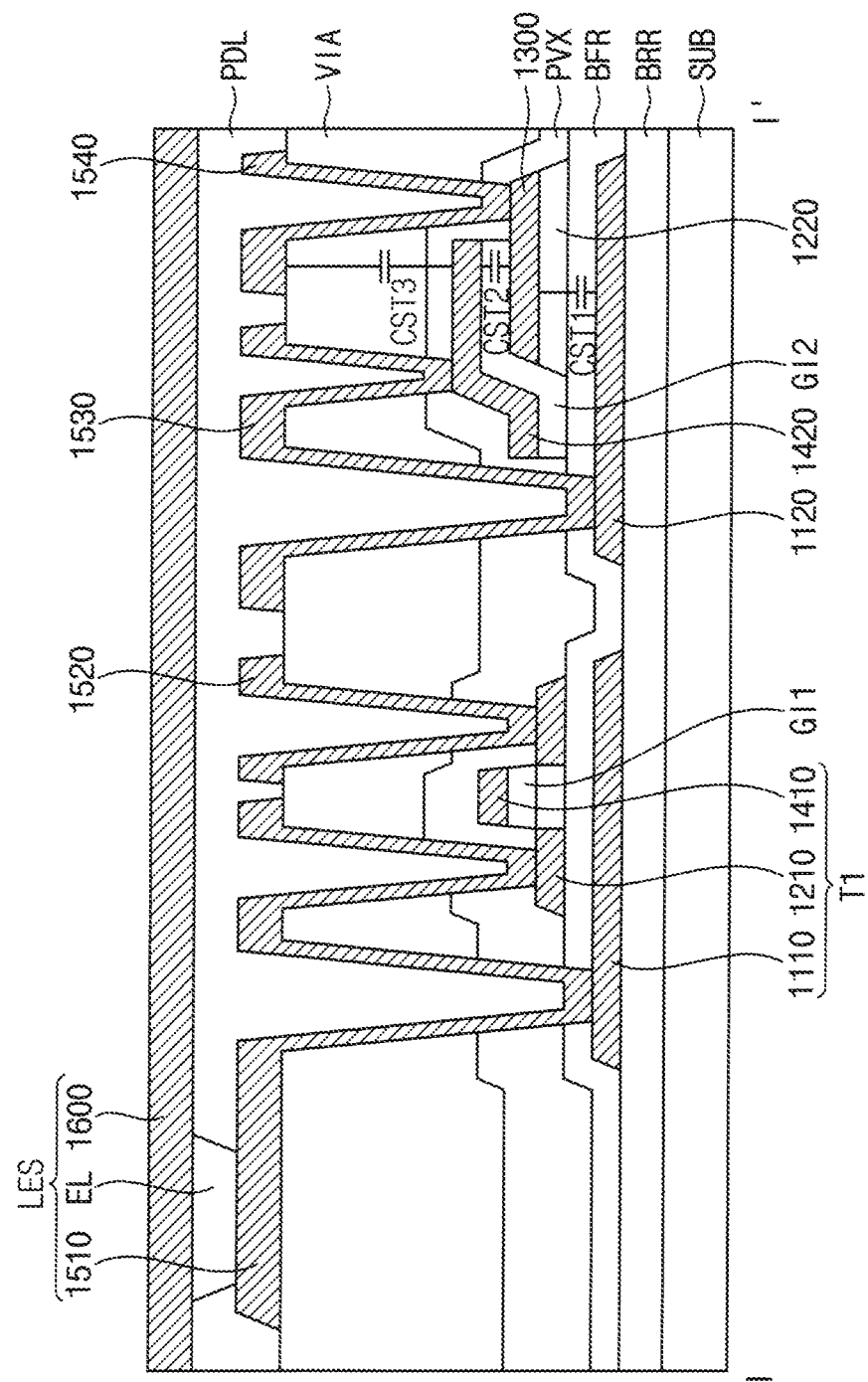

Referring to FIGS. 3 and 16, the first electrode 1510, the first power voltage line 1520, the bridge pattern 1530, and the fourth conductive pattern 1540 may be formed on the via insulating layer VIA. For example, the first electrode 1510, the first power voltage line 1520, the bridge pattern 1530, and the fourth conductive pattern 1540 may be formed by patterning a preliminary fourth conductive pattern that is entirely formed on the via insulating layer VIA.

In the manufacturing method of the display device 10, the second conductive pattern 1300 may be formed together with the active pattern 1210, and the third conductive pattern 1420 may be formed together with the gate electrode 1410. and the fourth conductive pattern 1540 may be formed together with the first electrode 1510. Accordingly, the manufacturing method may be performed without adding additional masks for forming the second, third, and fourth conductive patterns 1300, 1420, and 1540.

Although certain embodiments and implementations have been described herein, other embodiments and modifications will be apparent from this description. Accordingly, the disclosed concepts are not limited to such embodiments, but rather to the broader scope of the appended claims, with functional equivalents thereof to be included therein, and to various obvious modifications and equivalent arrangements as would be apparent to a person of ordinary skill in the art.

What is claimed is:

1. A display device comprising:
    a first transistor comprising a light blocking pattern on a substrate, an active pattern comprising a drain region and a source region on the light blocking pattern, and a gate electrode on the active pattern;
    a second transistor for providing a data voltage to the first transistor in response to a gate signal;
    a first electrode on the gate electrode, directly electrically connected to the light blocking pattern, and directly electrically connected to the drain region or the source region;
    an emission layer on the first electrode;
    a storage capacitor electrically connected to the gate electrode and the light blocking pattern, and comprising:
        a first conductive pattern in a same layer as the light blocking pattern;
        a second conductive pattern on the first conductive pattern and overlapping the first conductive pattern;
        a third conductive pattern in a same layer as the gate electrode, overlapping the second conductive pattern, at a different layer than the first conductive pattern, and electrically connected to the first conductive pattern; and a fourth conductive pattern on the third conductive pattern, overlapping the third conductive pattern, and electrically connected to the second conductive pattern; and a semiconductor pattern in a same layer as the active pattern, and contacting the second conductive pattern, wherein the semiconductor pattern is not doped, wherein the first electrode directly contacts the emission layer and the light blocking pattern, and directly contacts the drain region or the source region.

2. The display device of claim 1, wherein the first conductive pattern and the second conductive pattern form a first capacitance.

3. The display device of claim 2, wherein the second conductive pattern and the third conductive pattern form a second capacitance.

4. The display device of claim 3, wherein the third conductive pattern and the fourth conductive pattern form a third capacitance.

5. The display device of claim 1, wherein the first conductive pattern, the second conductive pattern, and the third conductive pattern overlap each other.

6. The display device of claim 1, wherein the first conductive pattern, the second conductive pattern, and the fourth conductive pattern overlap each other.

7. The display device of claim 1, wherein the first conductive pattern, the third conductive pattern, and the fourth conductive pattern overlap each other.

8. The display device of claim 1, wherein the second conductive pattern, the third conductive pattern, and the fourth conductive pattern overlap each other.

9. The display device of claim 1, further comprising a second electrode on the emission layer, wherein the fourth conductive pattern is in a same layer as the first electrode.

10. The display device of claim 1, wherein the first conductive pattern, the third conductive pattern, and the gate electrode are for receiving a first signal, and wherein the second conductive pattern, the fourth conductive pattern, and the light blocking pattern are for receiving a second signal.

11. The display device of claim 1, wherein the first conductive pattern and the third conductive pattern comprise a same material.

* * * * *